US010581397B2

(12) United States Patent
Rombach et al.

(10) Patent No.: US 10,581,397 B2
(45) Date of Patent: Mar. 3, 2020

(54) INTEGRATED CIRCUIT, CIRCUIT ASSEMBLY AND A METHOD FOR ITS OPERATION

(71) Applicant: TDK Corporation, Tokyo (JP)

(72) Inventors: Pirmin Hermann Otto Rombach, Kongens Lyngby (DK); Gino Rocca, Copenhagen (DK); Anton Leidl, Hohenbrunn (DE); Armin Schober, München (DE)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/758,303

(22) PCT Filed: Sep. 7, 2015

(86) PCT No.: PCT/EP2015/070401
§ 371 (c)(1),
(2) Date: Mar. 7, 2018

(87) PCT Pub. No.: WO2017/041822
PCT Pub. Date: Mar. 16, 2017

(65) Prior Publication Data
US 2018/0269843 A1      Sep. 20, 2018

(51) Int. Cl.
*H03G 3/30* (2006.01)
*H04R 1/04* (2006.01)
(Continued)

(52) U.S. Cl.
CPC ......... *H03G 3/3026* (2013.01); *H03F 3/183* (2013.01); *H03G 3/301* (2013.01); *H03G 5/16* (2013.01);
(Continued)

(58) Field of Classification Search
None
See application file for complete search history.

(56) References Cited

U.S. PATENT DOCUMENTS

| 4,457,020 A | 6/1984 | King |
| 4,944,024 A | 7/1990 | Leveque |

(Continued)

FOREIGN PATENT DOCUMENTS

| EP | 2890155 A1 | 7/2015 |
| JP | S63260209 A | 10/1988 |

(Continued)

*Primary Examiner* — Paul W Huber
(74) *Attorney, Agent, or Firm* — Slater Matsil, LLP

(57) ABSTRACT

An integrated circuit, a circuit assembly and a method for operation the integrated circuit are disclosed. In embodiments the integrated circuit includes at least one supply voltage terminal configured to receive a supply voltage for operation the integrated circuit, at least one input terminal configured to receive an analog input signal corresponding to an audio signal, at least one output terminal configured to provide an analog output signal and a signal strength detector configured to detect a signal strength of the analog input signal provided at the at least one input terminal, wherein the integrated circuit is configured to amplify an audio signal based on the detected signal strength and to output a corresponding amplified signal at the at least one output terminal, wherein the integrated circuit comprises a signaling circuit configured to indicate an amplification setting of the integrated circuit at the at least one supply voltage terminal.

16 Claims, 4 Drawing Sheets

(51) Int. Cl.
  *H03F 3/183* (2006.01)
  *H04R 3/00* (2006.01)
  *H03G 5/16* (2006.01)

(52) U.S. Cl.
  CPC ............ *H04R 1/04* (2013.01); *H04R 3/00* (2013.01); *H03F 2200/03* (2013.01); *H04R 2410/00* (2013.01)

(56) References Cited

U.S. PATENT DOCUMENTS

| 7,031,476 | B1 | 4/2006 | Chrisop et al. |
| 9,955,435 | B2 | 4/2018 | Tanaka et al. |
| 2003/0223592 | A1* | 12/2003 | Deruginsky ........ H04M 1/6008 381/92 |
| 2005/0047615 | A1 | 3/2005 | Kawamura et al. |
| 2005/0099229 | A1 | 5/2005 | Hebert et al. |
| 2005/0285682 | A1 | 12/2005 | Lee et al. |
| 2007/0184796 | A1 | 8/2007 | Drogi et al. |
| 2008/0015851 | A1 | 1/2008 | Yamada |
| 2009/0195305 | A1 | 8/2009 | Ballarin et al. |
| 2012/0250893 | A1 | 10/2012 | Carroll et al. |
| 2012/0281863 | A1 | 11/2012 | Iwano |
| 2014/0185832 | A1 | 7/2014 | Schober et al. |

FOREIGN PATENT DOCUMENTS

| JP | H09271086 A | 10/1997 |
| JP | 2000020054 A | 1/2000 |
| JP | 2000022465 A | 1/2000 |
| JP | 2001060836 A | 3/2001 |
| JP | 2003142968 A | 5/2003 |
| JP | 2004363743 A | 12/2004 |
| JP | 2005072983 A | 3/2005 |
| JP | 2010055077 A | 3/2010 |
| JP | 2014523663 A | 9/2014 |
| WO | 0178446 A1 | 10/2001 |
| WO | 2011055489 A1 | 5/2011 |
| WO | 2012163424 A1 | 12/2012 |
| WO | 2013099543 A1 | 7/2013 |
| WO | 2015038475 A1 | 3/2015 |

* cited by examiner

INTEGRATED CIRCUIT, CIRCUIT ASSEMBLY AND A METHOD FOR ITS OPERATION

This patent application is a national phase filing under section 371 of PCT/EP2015/070401, filed Sep. 7, 2015, which is incorporated herein by reference in its entirety.

TECHNICAL FIELD

Embodiments of the present invention relate to an integrated circuit comprising at least one supply voltage terminal, at least one input terminal configured to receive an analog input signal corresponding to an audio signal, and at least one output terminal, wherein the integrated circuit is configured to amplify the audio signal received from the input terminal and to output a corresponding amplified signal at the at least one output terminal. Further embodiments of the invention relate to a circuit assembly comprising a signal source, a signal processing device and an amplifier circuit arranged in a signal path between the signal source and the signal processing device. Yet other embodiments of the present invention relate to a method for operating a circuit assembly comprising a signal source, an amplifier circuit, and a signal processing device.

BACKGROUND

Integrated circuits, circuit assemblies and corresponding methods for their operation are known from the field of signal processing in general. In particular, such circuit arrangements can be used at an analog stage for amplifying a signal provided by a microphone or similar transducer.

In many applications, processing of signals having a high dynamic range is desirable. For example, when recording an audio or audio-visual performance using a portable device, both quiet and loud passages of the performance should be recorded with high-fidelity. However, in particular when using battery operated, mobile devices, the dynamic range of a processing device is often limited. For example, the dynamic range of an analog-to-digital converter used to convert an analog audio signal for a subsequent digital signal processing device may be restricted by the supply voltage available from the battery. In order to maintain a reasonable resolution over the entire signal range, some form of signal preconditioning may be used. For example, an analog signal provided by a microphone may be preamplified using an amplifier having an automatic gain control circuit. In this way, quieter passages of the performance can be amplified using a higher amplification setting, resulting in a greater signal amplitude, while louder parts of the performance can be amplified using a lower amplification setting.

In this context, US 2014/0185832 A1 discloses an assembly including the signal processing unit SPU shown in FIG. 4. A signal path SL guides from an analog signal input INA to an analog signal output OUTA. Within the signal path SL, an amplifier LNA is arranged to amplify the useful analog signal fed to the analog signal input INA and guides the amplified signal to the analog signal output OUTA. Coupled to the signal path SL and the amplifier LNA is an automatic gain control AGC controlling the gain of the amplifier LNA. Gain information about the current gain is provided by the automatic gain control AGC as a digital or analog signal which is delivered to a gain information output DGI. Thus, the signal processing unit SPU comprises an analog signal output OUTA and further the gain information output DGI.

The information provided at the gain information output DGI may be useful for further processing the amplified analog signal where information about the sensitivity of the signal processing unit SPU is needed. However, the circuit assembly disclosed in US 2014/0185832 A1 requires the provision of an additional terminal for providing the gain information. In particular in highly integrated circuits and miniaturized circuit design, the provision of an additional terminal may be problematic. Furthermore, such a circuit assembly may not be used in existing chip packages or circuit arrangements, which do not allow the provision of an additional terminal to supply the required gain information.

SUMMARY OF THE INVENTION

Embodiments of the present invention provide alternative devices, systems and methods, which allow signal processing with a high dynamic range and which are compatible with existing circuit arrangement. In various embodiments, they should be compatible with existing connection schemes, as given by the number and type of terminals of known integrated amplifier circuits.

According to a first aspect of the present invention, an integrated circuit is provided. The integrated circuit comprises at least one supply voltage terminal configured to receive a supply voltage for operation of the integrated circuit. The integrated circuit further comprises at least one input terminal configured to receive an analog input signal corresponding to an audio signal and at least one output terminal configured to provide an analog output signal. The integrated circuit further comprises a signal strength detector configured to detect a signal strength of the analog input signal provided at the at least one input terminal. The integrated circuit is configured to amplify the audio signal based on the detected signal strength and to output a corresponding amplified signal at the at least one output terminal. The integrated circuit further comprises a signaling circuit configured to indicate an amplification setting of the integrated circuit at the at least one supply voltage terminal or the at least one output terminal.

By detecting a signal strength using a signal strength detector an integrated circuit used for amplifying an audio signal can be configured in accordance with the signal strength of an input signal. The internal configuration of the integrated circuit can be signaled to external entities, such as a signal processing device, by means of a signaling circuit using an existing terminal of the integrated circuit, in particular the output terminal or the supply voltage terminal. In this way, provision of an addition terminal can be prevented, while allowing for a high dynamic range of the audio signal.

According to a first embodiment of the first aspect, the signaling circuit comprises a signal generator and is connected to the at least one output terminal. The signaling circuit is configured to generate a predetermined first frequency signal and to superimpose the amplified signal with the predetermined first frequency signal if the integrated circuit is operating in a first amplification setting. Moreover, the signaling circuit is configured not to superimpose the amplified signal with the predetermined first frequency signal or to superimpose the amplified signal with a predetermined second frequency signal if the integrated circuit is operating in a second amplification setting. In this embodiment, the provision of an additional frequency signal generated internally in the integrated circuit may be used to indicate the amplification setting.

Preferably, the analog input signal received at the at least one first input terminal has a predetermined signal bandwidth and the predetermined first frequency signal has a frequency outside the predetermined signal bandwidth, in particular above an upper limit of the predetermined signal bandwidth. For example, in case the analog input signal represents an audio signal in the range of 20 Hz to 20 kHz, the first predetermined signal may be an audio signal in the ultrasonic range, i.e., above 20 kHz.

According to a second embodiment of the first aspect, the signaling circuit comprises at least one electrical load and is connected to the at least one supply voltage terminal. The signaling circuit is configured to activate a predetermined first electrical load if the integrated circuit is operating in a first amplification setting, and not to activate a predetermined first electrical load or to activate a predetermined second load if the integrated circuit is operating in a second amplification setting. In this embodiment, the amplification setting of the integrated circuit can be signaled by means of a decreased impedance or drop in the supply voltage supplied to the integrated circuit.

According to a third embodiment of the first aspect, the signaling circuit comprises an offset generator and is connected to the at least one signal output terminal. The signaling circuit is configured to generate a predetermined first offset voltage and to superimpose the amplified signal with the predetermined first offset voltage if the integrated circuit is operating in a first amplification setting. If the integrated circuit is operating in the second amplification setting, the amplified signal is not superimposed with the predetermined first offset voltage or is superimposed with a predetermined second offset voltage. An offset voltage provided via the at least one output terminal can easily be detected and filtered by a high pass filter. As such, signaling of the amplification setting of the integrated circuit is enabled without significantly disturbing the amplified analog output signal.

According to one alternative, the signaling circuit is configured to provide a first control signal to indicate a first amplification setting for a first predetermined time period when the integrated circuit is switched into an operating mode using the first amplification setting, and to provide a second control signal to indicate a second amplification setting for a second predetermined time period when the integrated circuit is switched into an operating mode using the second amplification setting. According to a second alternative, the signaling circuit is configured to provide a first control signal to indicate a first amplification setting as long as the integrated circuit is operating using the first amplification setting, and not to provide the first control signal or to provide a second control signal to indicate a second amplification setting as long as the integrated circuit is operating using the second amplification setting. By generating a first and, optionally, a second control signal as long as the integrated circuit is operating using a first or second amplification setting, the current amplification setting of the integrated circuit can be detected at any time. However, in order to limit unnecessary consumption of electrical energy or output signal disturbance, a first or a second control signal may only be activated when the operating mode of the integrated circuit has previously changed.

As detailed above, the integrated circuit may be operated in one of two predetermined operating modes. Alternatively, the integrated circuit may be operated with one of a plurality of different gain settings of an adjustable amplifier and/or one of a plurality of different microphone bias voltage settings of a bias voltage generator in order to achieve a yet higher dynamic range.

The signal strength detector may be configured to determine a sound pressure level of the audio signal. The integrated circuit may comprise a first input terminal and a second input terminal being configured as an input for a differential signal source. The integrated circuit may further comprise a first signal output terminal and a second signal output terminal being configured as a signal output for a differential signal processing device.

According to a second aspect of the present invention, a circuit assembly is disclosed. The circuit assembly comprises a signal source providing a first analog signal, a signal processing device configured to process a second analog signal and an amplifier circuit comprising a signal strength detector and a signaling circuit. The amplifier circuit is arranged in a signal path between the signal source and the signal processing device. The signal strength detector is configured to detect a signal strength of the first analog signal. The amplifier circuit is configured to amplify the first analog signal based on the detected signal strength and to output an amplified version of the first analog signal comprised in the second analog signal. The signaling circuit is configured to indicate an amplification setting of the amplifier circuit by providing a control signal comprised the second analog signal or by modifying a power consumption of the amplifier circuit.

The circuit assembly according to the second aspect allows the indication of an amplifier setting to a signal processing device without the provision of an additional terminal at an amplifier circuit or an additional connection between the amplifier circuit and a signal processing device.

According to one embodiment, the circuit assembly further comprises a load detection circuit, the load detection circuit being connected externally to the at least one supply voltage terminal of the amplifier circuit. The load detection circuit is configured to provide a control signal indicative of the amplification setting of the amplifier circuit to the signal processing device. By use of an external load detection circuit, a drop in the supply voltage of the amplifier circuit can be detected. In this way, an appropriate control signal indicative of the amplification setting may be provided to other parts of the circuit assembly.

According to at least one embodiment, the signal source comprises a high dynamic range analog microphone. According to at least one embodiment, the signal processing device comprises at least one of an analog-to-digital converter, an analog signal processor, a microcontroller, a digital signal processor, an audio CODEC and a power amplifier.

According to a third aspect of the present invention, a method for operating a circuit assembly comprising a signal source, an amplifier circuit, and a signal processing device is provided. The method comprises the following steps: detecting a signal strength of a signal provided by the signal source; selecting an amplification setting based on the detected signal strength; amplifying the provided signal based on the amplification setting and providing the amplified signal to the signal processing device; and signaling the amplification setting to the signal processing device by modifying the amplified signal provided to the signal processing device or by modifying a power consumption of the amplifier circuit.

By means of the above steps, an amplification setting of an amplifier circuit can be signaled to a signal processing device without the provision of an additional terminal.

Further advantageous embodiments of the present invention are disclosed in the attached claims as well as the detailed description of the currently preferred embodiments.

BRIEF DESCRIPTION OF THE DRAWINGS

Various embodiments of the present invention will be described with reference to the attached figures. Therein, the same reference symbols will be used with respect to similar features of different embodiments. Unless otherwise stated, the description of a particular feature described with respect to one embodiment equally applies to a corresponding feature of the other embodiments.

DETAILED DESCRIPTION OF ILLUSTRATIVE EMBODIMENTS

Figure 1A:
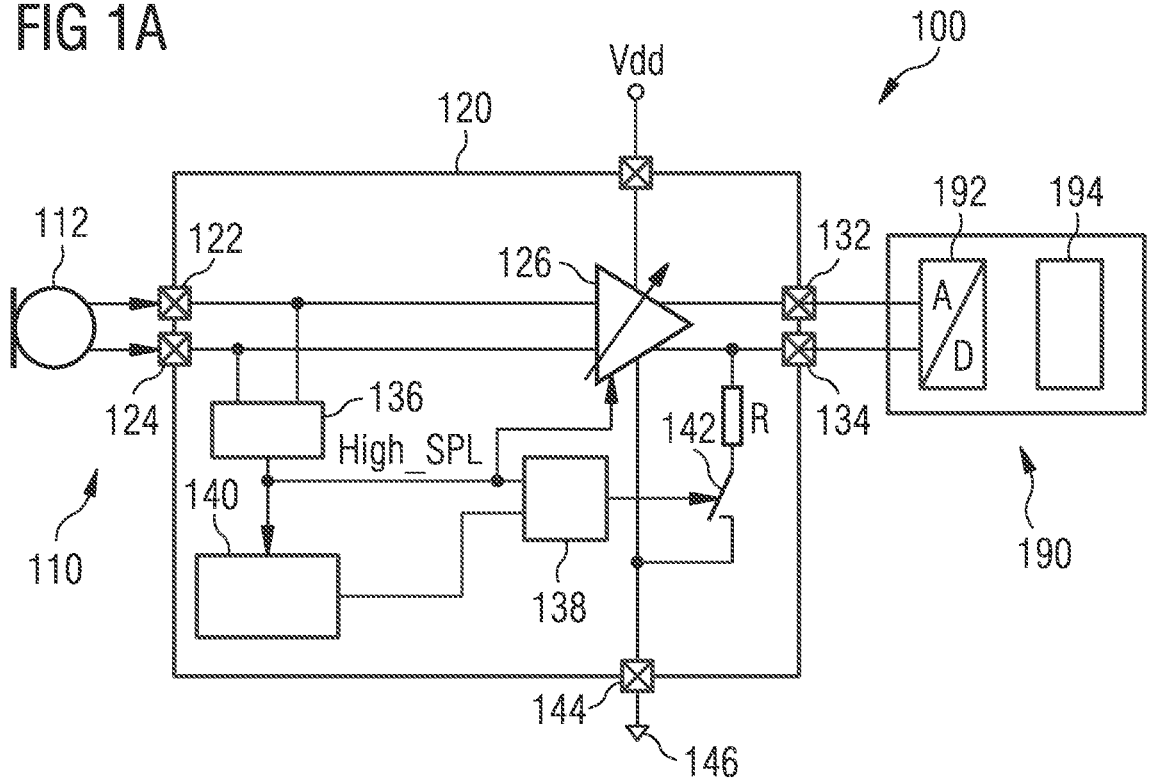
FIG. 1A shows a simplified diagram of a first circuit assembly according to a first embodiment.

According to a first embodiment of the present invention shown in FIG. 1A, an additional high frequency signal is superimposed on an output signal of an amplifier circuit.

FIG. 1A shows a circuit assembly 100 comprising a signal source 110, an application specific integrated circuit (ASIC) 120 implementing an amplifier circuit, and a signal processing device 190. In the described embodiment, the signaling source no comprises a differential microphone 112. The microphone 112 is connected to the ASIC 120 by means of two input terminals 122 and 124. For example, the first input terminal 122 may be a positive input terminal, and the second input terminal 124 may be a negative input terminal of a differential signal line. The analog signal provided via the input terminals 122 and 124 is amplified by an amplifier 126 and the output signal of the amplifier 126 is provided at two output terminals 132 and 134 of a differential signal output.

In the described embodiment, the amplifier 126 is a preamplifier with two different gain settings. The gain setting is selected based on a control signal High_SPL generated by signal strength detector in the form of a sound pressure monitor 136. If the detected sound pressure at the input terminals 122 and 124 exceeds a predetermined threshold, the control signal High_SPL is provided to the amplifier 126. If the sound pressure level lies below the predetermined threshold level, the corresponding control signal is not provided. The control signal High_SPL is also provided to a logic circuit 138 and used as a mask signal to mask a high frequency clock signal which is provided by a clock generator 140. For example, the clock generator 140 may provide a fixed frequency signal with a frequency of 25 kHz. If the control signal High_SPL is provided to the logic circuit 138, the signal generated by the clock generator 140 is used to operate a switch 142. The switch 142 connects the negative output terminal 134 over an internal resistor R with a terminal 144 for connecting the ASIC 120 to an electrical ground potential 146. In this way, an additional signal with a frequency of the clock signal generated by the clock generator 140 is superimposed onto the output signal provided by the ASIC 120.

In the described embodiment, the signal processing device 190 comprises an analog-to-digital converter 192 as well as a digital CODEC 194. Based on a frequency spectrum analysis performed by the CODEC 194, the additional signal generated by the signaling circuit of the ASIC 120 can be detected. Accordingly, the signal processing device 190 can be made aware of the amplification setting of the amplifier 126 and process the amplified signal accordingly.

Figure 1B:
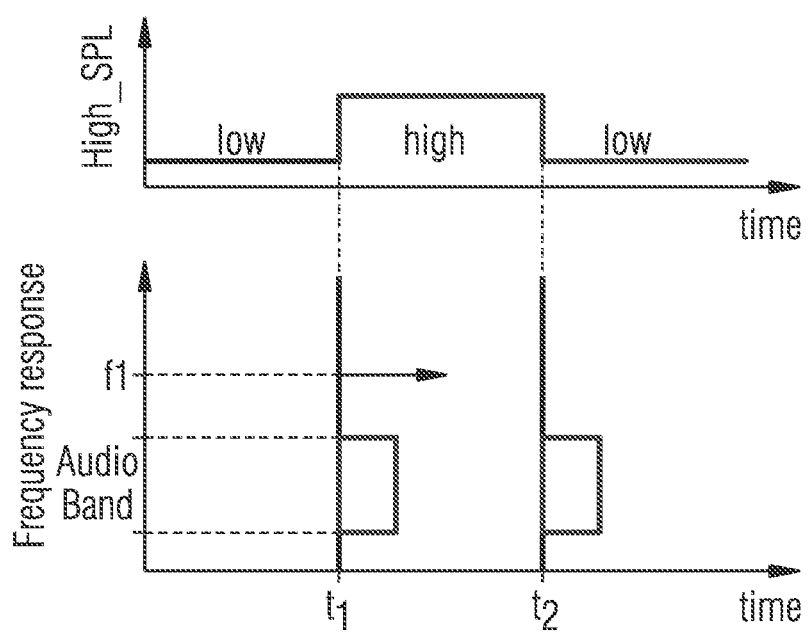
FIG. 1B shows a first signaling diagram for the circuit assembly according to FIG. 1A.

FIG. 1B shows a signal level of the control signal High_SPL over time together with a frequency response of the ASIC 120. As can be seen in the lower part of FIG. 1B, in the time period between $t_1$ and $t_2$, in which a high sound pressure level is detected by the sound pressure monitor 136, an additional high frequency signal with a frequency $f_1$ is provided. In the embodiment described with respect to FIG. 1B, the additional signal is provided as long as the control signal High_SPL is high. The frequency $f_1$ of the provided signal lies above the bandwidth of an audio signal provided by the microphone 112, which is amplified by the ASIC 190. In this way, the provision of the additional signal does not interfere with the useful signal provided to the signal processing device 190.

Figure 1C:
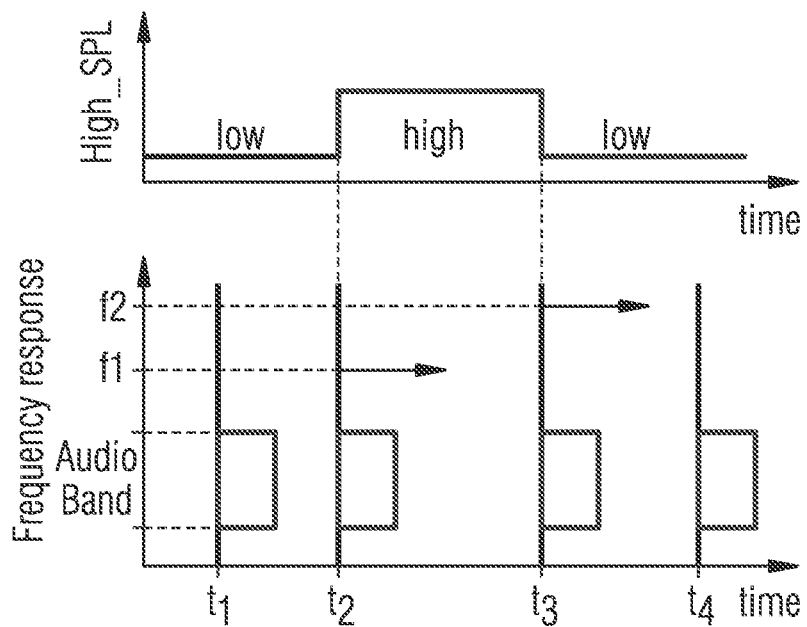
FIG. 1C shows a second signaling diagram for the circuit assembly according to FIG. 1A.

FIG. 1C shows an alternative signaling scheme according to another embodiment. In this embodiment, the control signal High_SPL is also provided to the clock generator 140. According to the control signal High_SPL, the clock generator 140 generates a clock frequency with either a first frequency or a second, different frequency, resulting in an additional signal tone with a first frequency $f_1$ or a second frequency $f_2$, respectively. Moreover, the logic circuit 138 according to this embodiment is configured to pass the clock signal only for a predetermined period of time after the control signal High_SPL has changed. Accordingly, after switching to a low gain setting for a high sound pressure at time $t_2$, a signal tone with a frequency $f_1$ is superimposed on the output signal for a predetermined time period. After switching to a high gain setting for a low sound pressure at time $t_3$, a signal tone with the frequency $f_2$ is superimposed on the output signal for the predetermined time period. In time periods, in which the control signal High_SPL is stable, e.g., at times $t_1$ and $t_4$, no additional signal tone is superimposed on the output signal.

Alternatively, in an embodiment not shown, a second signal tone with the same frequency as used before is superimposed on the output signal after switching the amplifier 126 back to the a high gain setting. In this embodiment, the ASIC 120 starts in a predefined normal mode on activation, e.g., with a high gain setting, and then, on each toggling of the amplification setting, superimposes a signal tone with the same frequency, e.g., frequency $f_1$, on the output signal.

Figure 2A:
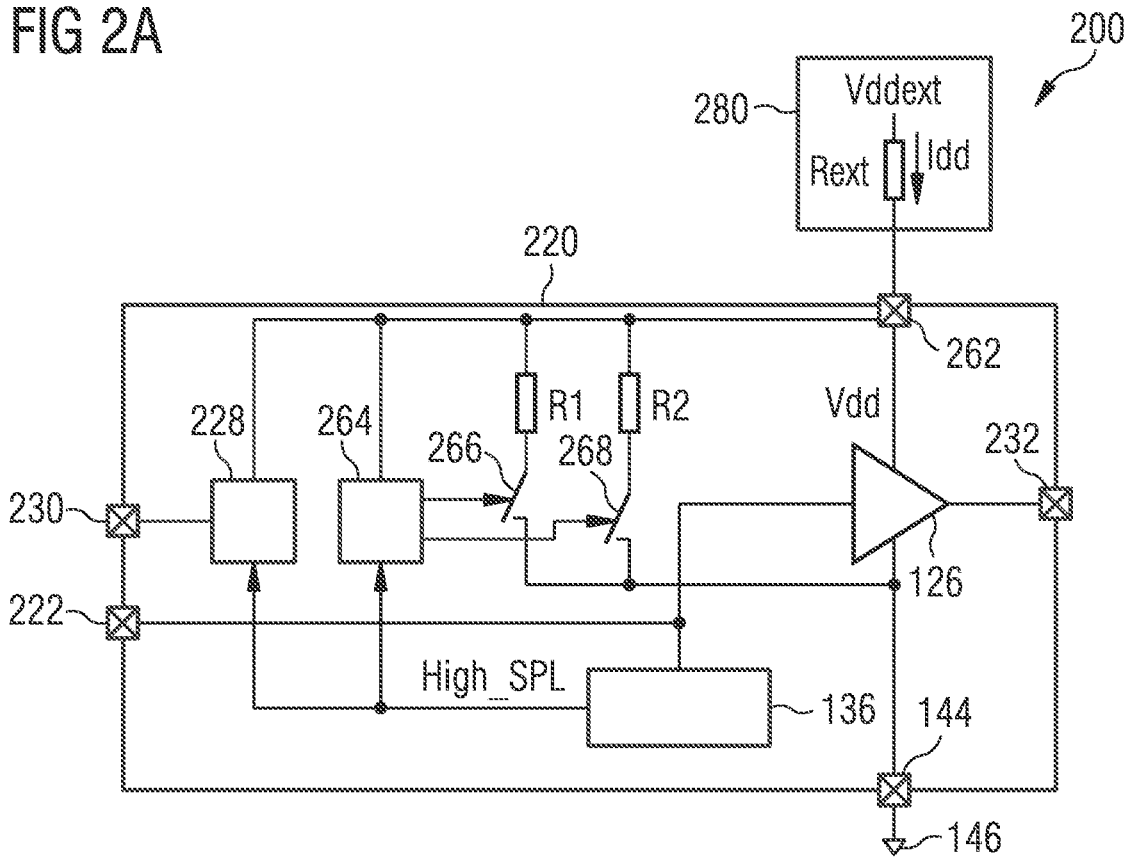
FIG. 2A shows a simplified diagram of a second circuit assembly according to a second embodiment.

According to a second embodiment of the present invention shown in FIG. 2A, a current signal is superimposed on a normal current consumption of an amplifier circuit. Moreover, instead of an adjustable amplifier, an adjustable bias voltage generator is used to change an amplification ratio of the amplifier circuit.

FIG. 2A shows a circuit assembly 200 comprising an application specific integrated circuit (ASIC) 220 implementing an amplifier circuit and a load detection circuit 280. Its intended function and use is similar to that of the ASIC 120 according to the first embodiment. However, in the embodiment shown in FIG. 2A, a signal provided by a single ended transducer (not shown) is provided at a single input terminal 222, amplified by an amplifier 126 and provided as an amplified signal at a single output terminal 232 for a subsequent signal processing device (not shown).

The ASIC 220 further comprises a bias voltage generator 228 for generating a bias voltage for a microphone (not shown in FIG. 2A) connected to the input terminal 224. Depending on the microphone type, the bias voltage may be provided separately by means of a bias voltage terminal 230 as shown in FIG. 2A or may be superimposed on the input signal and provided over the input terminal 222. Instead of changing an amplification ratio of the amplifier 126 directly, in this embodiment, the bias voltage provided by the bias voltage generator 228 is modified in accordance with a control signal High_SPL indicating a high sound pressure level. If a high sound pressure level is detected, a low bias voltage is supplied to the microphone resulting in a low amplification setting, and vice versa.

In the described embodiment, a supply voltage Vdd is provided to the ASIC 220 by means of a supply voltage terminal 262. The supply voltage Vdd supplied at supply voltage terminal 262 is used, among others, to power the bias voltage generator 228, the amplifier 126, a logic circuit 264, and a sound pressure monitor 136. In the embodiment shown in FIG. 2A, the control signal High_SPL determined by the sound pressure monitor 136 is provided to the bias voltage generator 228 and the logic circuit 264. Depending on the control signal High_SPL the logic circuit 264 selectively closes a first switch 266 or a second switch 268. By closing the first switch 266, a first internal load $R_1$ is connected to the supply voltage terminal 262. By closing the second switch 268, a second internal load $R_2$ is connected to the supply voltage terminal 262.

The load detection circuit 280 comprises a detection resistor Rext. Based on the voltage drop across the detection resistor Rext, a current Idd through the ASIC 220 can be determined. Moreover, if the current consumption $Idd_0$ of the ASIC 220 without activated loads $R_1$ and $R_2$ is known, based on the detected current Idd, activation of the loads $R_1$ and $R_2$ can be detected by the load detection circuit 280. Although not shown in FIG. 2A, the load detection circuit 280 provides a corresponding control signal to any subsequent processing device which requires knowledge about the amplification setting of the ASIC 220.

Figure 2B:
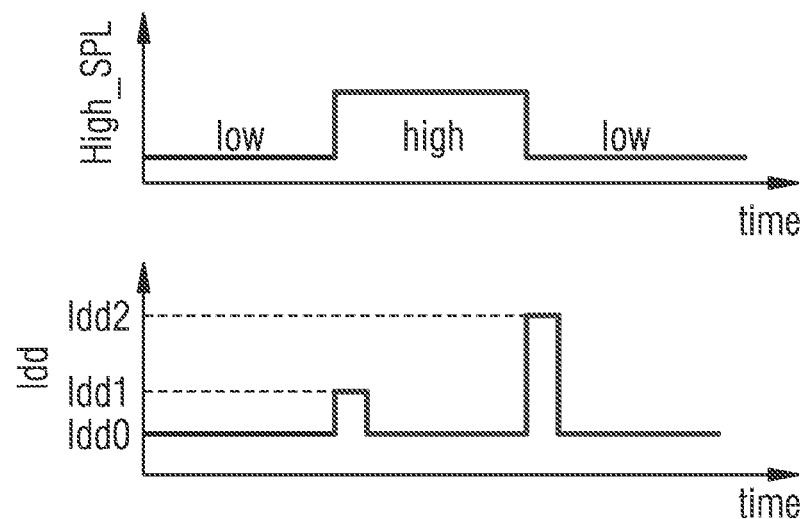
FIG. 2B shows a signaling diagram for the circuit assembly according to FIG. 2A.

The operation of the circuit assembly 200 according to FIG. 2A can best be understood with reference to the signal diagram of FIG. 2B. Therein, one can see that, immediately after a transition from a mode with high amplification to a mode with low amplification, i.e., a transition of the control signal High_SPL from a low state to a high state, a first peak on the input current signature of the ASIC 220 to an operating current $Idd_1$ corresponding to the activation of the first load $R_1$ can be observed for a predetermined period of time. After the predetermined time period, the first load $R_1$ is disconnected by the logic circuit 264 using the first switch 266 and the current of the ASIC 220 returns to its nominal current $Idd_0$. At the subsequent transition from a state with high sound pressure level to a state with low sound pressure level, a second peak is imprinted on the current signature of the ASIC 220. The peak current consumption in this period corresponds to $Idd_2$. If the second peak differs in amplitude to the first peak as shown in FIG. 2A, an absolute amplification setting may be communicated to the load detection circuit 280. Alternatively, the second peak may have the same amplitude as the first peak in order to encode a cyclic mode change or mode toggling as described above with respect to the first embodiment. Since the additional loads $R_1$ and $R_2$ are only activated for relatively short periods, they do not significantly affect the energy efficiency of the circuit assembly 200.

Of course, the additional load $R_1$ may also be activated for the entire duration in which the amplifier 126 is operated in the first amplification setting. In this case, no additional load may be necessary to indicate the second amplification signal. Preferably, if the characteristics of the signal source no are known, the additional load is activated in the operation mode of the amplifier that is used less in order to improve the energy efficiency of the ASIC 220.

Figure 3A:
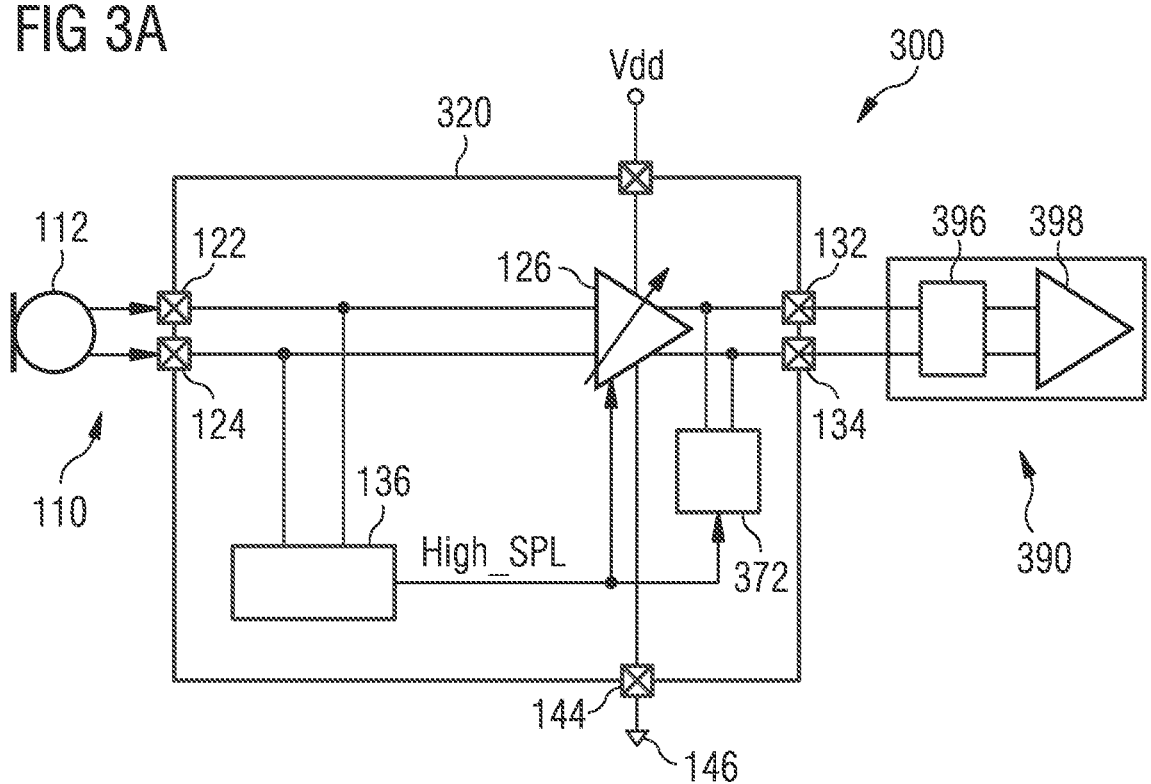
FIG. 3A shows a simplified diagram of a third circuit assembly according to a third embodiment.

According to a third embodiment of the present invention shown in FIG. 3A, a DC shift is applied to the output signal of an amplifier circuit.

FIG. 3A shows a circuit assembly 300 comprising a signal source 110, an application specific integrated circuit (ASIC) 320 implementing an amplifier circuit and a signal processing device 390. Its intended function and use is similar to that of the ASIC 120 according to the first embodiment.

The ASIC 320 shown in FIG. 3A is connected to a differential microphone 112. In order to signal an amplification setting of an adjustable amplifier 126, a DC shift is forced to the common mode output voltage at output terminals 132 and 134 of the ASIC 320. Typically, the output voltage of an amplifier circuit is centered on a mid-rail voltage, for example, around 0.9 V for an ASIC 320 having a supply voltage Vdd of 1.8 V. In order to shift the DC component of the output terminals 132 and 134, the sound pressure monitor 136 provides a control signal High_SPL to a DC shifter 372. In the described embodiment, a bias voltage of, for example, 0.4 V is superimposed on the amplified output signal at the output terminals 132 and 134.

In the signal processing device 390, a DC detector 396 may be used to detect the DC shift. Moreover, a subsequent subtraction unit 398 will automatically cancel out any DC component provided by the DC shifter 372, such that the signal provided at the output tunnels 132 and 134 can be processed in the same way as in a conventional system.

Figure 3B:
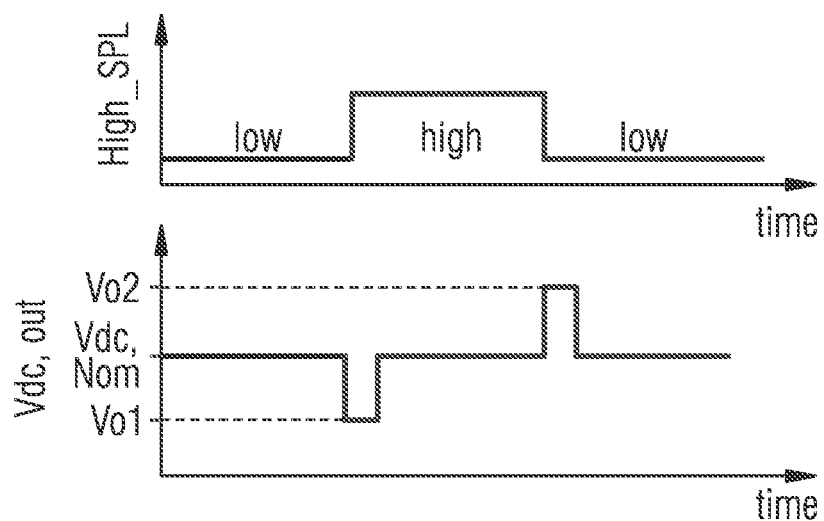
FIG. 3B shows a signal diagram for the circuit assembly according to FIG. 3A.
Figure 4:
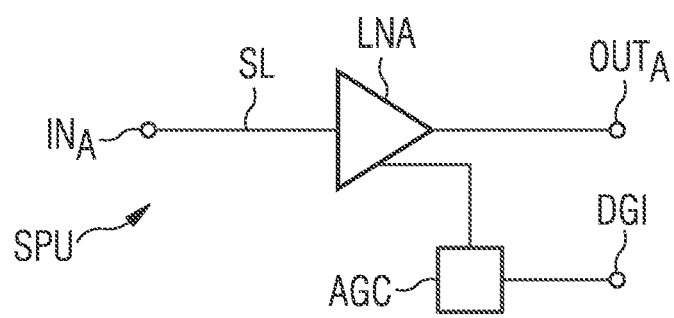
FIG. 4 shows a signal processing unit according to the prior art.

As shown in FIG. 3B, the DC shift may only be provided for a short period after the transition from one amplification setting to another amplification setting. For example, when changing from an amplification setting suitable for a low sound pressure level to an amplification setting suitable for a high sound pressure level, a negative DC shift to voltage level $V_{01}$ may be provided for a predetermined period of time. Inversely, when switching back to the previous amplification setting, a DC voltage shift to the voltage potential of $V_{02}$ may be provided. Alternatively, as described above, a "toggle" signal may be provided using only a positive or negative offset at changes of the amplification setting, or a corresponding signaling may be applied as long as a particular amplification setting is used by the amplifier 126.

Although the invention has been described with respect to amplifier circuits having only two different amplification settings, i.e., two different gain values or bias voltage levels, the invention can also be applied to signal strength detectors and corresponding automatic gain circuits or automatic bias controllers having a plurality of levels. For example, each amplification setting could be communicated by use of a tone with a corresponding frequency, a corresponding current signal or a corresponding DC shift. Moreover, even an analog gain setting or microphone bias voltage change may be indicated based on a corresponding frequency of the superimposed control signal, a corresponding current signal or a corresponding DC offset.

While the embodiment has been described with respect to ASICs 120, 220 and 320, other integrated circuits or circuit arrangements may be used to implement the amplifier circuit. Any such circuit only needs to comprise a supply voltage terminal, a ground potential terminal, one or two input terminals and one or two output terminals. Thus, a conventional chip package having between 4 and 6 output pins can be used in accordance with the present invention.

The invention claimed is:

1. A circuit assembly comprising:
   a signal source configured to provide a first analog signal;
   a signal processing device configured to process a second analog signal;
   an amplifier circuit comprising at least one supply voltage terminal configured to receive a supply voltage for operating the amplifier circuit, a signal strength detector and a signaling circuit, the amplifier circuit being arranged in a signal path between the signal source and the signal processing device,
   wherein the signal strength detector is configured to detect a signal strength of the first analog signal,
   wherein the amplifier circuit is configured to amplify the first analog signal based on the detected signal strength and to output an amplified version of the first analog signal comprised in the second analog signal, and
   wherein the signaling circuit is configured to indicate an amplification setting of the amplifier circuit at the at least one supply voltage terminal by modifying a power consumption of the amplifier circuit; and
   a load detection circuit connected externally to the at least one supply voltage terminal of the amplifier circuit, wherein the load detection circuit is configured to provide a control signal indicative of the amplification setting of the amplifier circuit to the signal processing device.

2. The circuit assembly according to claim 1, wherein the signal source comprises a high dynamic range analog microphone.

3. The circuit assembly according to claim 1, wherein the signal processing device comprises at least one of an analog-to-digital converter, an analog signal processor, a microcontroller, a digital signal processor, an audio codec, or a power amplifier.

4. A method for operating the circuit assembly according to claim 1, the method comprising:
   detecting the signal strength of the first analog signal provided by the signal source;
   selecting the amplification setting based on the detected signal strength;
   amplifying the provided first analog signal based on the amplification setting and providing the amplified signal to the signal processing device; and
   indicating the amplification setting at the at least one supply voltage terminal of the amplifier circuit by modifying the power consumption of the amplifier circuit.

5. The circuit assembly according to claim 1, wherein the signaling circuit comprises at least one electrical load and is connected to the at least one supply voltage terminal, wherein the signaling circuit is configured to activate a predetermined first electrical load when the circuit assembly is operated in a first amplification setting, and not to activate the predetermined first electrical load or to activate a predetermined second electrical load when the circuit assembly is operated in a second amplification setting.

6. The circuit assembly according to claim 1, wherein the signaling circuit is configured to provide a first control signal to indicate a first amplification setting for a first predetermined time period when the circuit assembly is switched into an operating mode using the first amplification setting, and to provide a second control signal to indicate a second amplification setting for a second predetermined time period when the circuit assembly is switched into an operating mode using the second amplification setting.

7. The circuit assembly according to claim 1, wherein the signaling circuit is configured to provide a first control signal to indicate a first amplification setting as long as the circuit assembly is operated using the first amplification setting, and not to provide the first control signal or to provide a second control signal to indicate a second amplification setting as long as the circuit assembly is operated using the second amplification setting.

8. The circuit assembly according to claim 1, wherein the amplifier circuit comprises an adjustable amplifier configured to be operated with one of a plurality of different gain settings.

9. The circuit assembly according to claim 1, wherein the amplifier circuit comprises a bias voltage generator configured to be operated with one of a plurality of different microphone bias voltage settings.

10. The circuit assembly according to claim 1, wherein the signal strength detector is configured to determine a sound pressure level of an audio signal.

11. The circuit assembly according to claim 1, wherein the signal processing device comprises a power amplifier.

12. The circuit assembly according to claim 1, wherein the signal processing device comprises an audio codec.

13. The circuit assembly according to claim 1, wherein the signal processing device comprises a digital signal processor.

14. The circuit assembly according to claim 1, wherein the signal processing device comprises a microcontroller.

15. The circuit assembly according to claim 1, wherein the signal processing device comprises an analog signal processor.

16. The circuit assembly according to claim 1, wherein the signal processing device comprises an analog-to-digital converter.

* * * * *